United States Patent
Wang et al.

(10) Patent No.: US 12,079,556 B2
(45) Date of Patent: Sep. 3, 2024

(54) SYNCHRONOUS FIFO

(71) Applicant: SUZHOU METABRAIN INTELLIGENT TECHNOLOGY CO., LTD., Jiangsu (CN)

(72) Inventors: Hongliang Wang, Jiangsu (CN); Deshan Zhang, Jiangsu (CN); Qi Mou, Jiangsu (CN)

(73) Assignee: SUZHOU METABRAIN INTELLIGENT TECHNOLOGY CO., LTD., Jiangsu (CN)

( * ) Notice: Subject to any disclaimer, the term of this patent is extended or adjusted under 35 U.S.C. 154(b) by 0 days.

(21) Appl. No.: 18/564,546

(22) PCT Filed: Jun. 22, 2022

(86) PCT No.: PCT/CN2022/100478
§ 371 (c)(1),
(2) Date: Nov. 27, 2023

(87) PCT Pub. No.: WO2023/103337
PCT Pub. Date: Jun. 15, 2023

(65) Prior Publication Data
US 2024/0256748 A1 Aug. 1, 2024

(30) Foreign Application Priority Data
Dec. 8, 2021 (CN) .......................... 202111487415.2

(51) Int. Cl.
*G06F 30/33* (2020.01)
(52) U.S. Cl.
CPC .................... *G06F 30/33* (2020.01)
(58) Field of Classification Search
USPC ........................................ 716/108
See application file for complete search history.

(56) References Cited

U.S. PATENT DOCUMENTS

| 6,118,835 A * | 9/2000 | Barakat | H04N 7/0102 |
| | | | 375/372 |
| 2003/0101307 A1* | 5/2003 | Gemelli | G06F 30/30 |
| | | | 710/305 |

(Continued)

FOREIGN PATENT DOCUMENTS

| CN | 101477833 A | 7/2009 |
| CN | 111832240 A | 10/2010 |

(Continued)

OTHER PUBLICATIONS

Chinese Search Report received for CN Application No. 2021114874152 on Jan. 10, 2022, 2 pgs.

(Continued)

*Primary Examiner* — Mohammed Alam
(74) *Attorney, Agent, or Firm* — Merchant & Gould P.C.

(57) ABSTRACT

Provided is a synchronous FIFO, including a data storage circuit, a first logic circuit, a second logic circuit and indication circuits. The data storage circuit includes N first registers, N first multiplexers and N first deciders, where N is a positive integer; and the N first registers and the N first multiplexers are alternately connected. Based on the registers, the synchronous FIFO builds a storage required by the FIFO, and primarily includes the registers, the multiplexers and the deciders, the use of an RAM is avoided, that is, there is no need to occupy the RAM, and there is no need to perform RAM read-write enabling and address control, thereby avoiding wasting RAM resources. In designs with lower storage depth requirements, few resources are occupied, so that a chip area is greatly reduced, the cost is reduced, and layout and wiring are more convenient.

20 Claims, 3 Drawing Sheets

(56) References Cited

U.S. PATENT DOCUMENTS

| | | | | |
|---|---|---|---|---|
| 2005/0091465 A1* | 4/2005 | Andreev | ............. | G06F 12/06 |
| | | | | 711/168 |
| 2005/0165995 A1* | 7/2005 | Gemelli | ............. | G06F 30/30 |
| | | | | 710/305 |
| 2008/0008021 A1* | 1/2008 | Sarwary | ............. | G06F 30/33 |
| | | | | 365/221 |
| 2011/0013650 A1* | 1/2011 | McElvain | ............. | G06F 30/30 |
| | | | | 370/503 |

FOREIGN PATENT DOCUMENTS

| | | |
|---|---|---|
| CN | 102053815 A | 5/2011 |
| CN | 205176827 U | 4/2016 |
| CN | 106776357 A | 5/2017 |
| CN | 113900975 A | 1/2022 |

OTHER PUBLICATIONS

Chinese Search Report received for CN Application No. 2021114874152 on Dec. 8, 2021, 2 pgs.

International Search Report & Written Opinion for PCT International Serial No. PCT/CN2022/100478 on Aug. 5, 2022, 12 pgs.

* cited by examiner

SYNCHRONOUS FIFO

CROSS-REFERENCE TO RELATED APPLICATION

The present application is a National Stage Application of PCT International Application No.: PCT/CN2022/100478 filed on Jun. 22, 2022, which claims priority to Chinese Patent Application 202111487415.2, filed in the China National Intellectual Property Administration on Dec. 8, 2021, the disclosure of which is incorporated herein by reference in its entirety.

TECHNICAL FIELD

The present disclosure relates to the technical field of digital circuits, and in particular, to a synchronous First Input First Output (FIFO).

BACKGROUND

In design of digital circuits such as a Field-Programmable Gate Array (FPGA), an FIFO is a commonly used module. The FIFO may be classified into a synchronous FIFO and an asynchronous FIFO. The input and the output of the synchronous FIFO are the same clock, while the input and the output of the asynchronous FIFO are different clocks. The synchronous FIFO is mainly used for caching data or commands, so as to present the data or commands from losing, and is generally used for rate matching or data synchronization between modules, so as to improve the system transmission or processing performance.

The inventor is aware that, as shown in FIG. 1, a storage design of the FIFO is generally based on a Random Access Memory (RAM) at present, and with the cooperation between the RAM, a controller, a register and the like, a first input first output function of the FIFO is completed. However, the RAM is a type of dedicated resources, and resources of this type generally have very small size, for example, there may be only tens of KBs in each RAM, therefore when a large number of FIFOs need to be implemented in the design, and the depths required by the FIFOs are relatively small, the resources of this type will be wasted. In addition, in the chip design, the RAM is also a type of specific resources, and the resources of this type have a most basic area no matter how much storage is required, and on this basis, the more the storage is required, the greater the occupied area is (the more expensive the tape-out is and the higher the power consumption is). After the design is completed, the RAM resources need to be placed separately, such that the back-end layout and wiring are relatively more complex.

Therefore, how to solve the above technical defects has become a technical problem to be solved urgently by those having ordinary skill in the art.

SUMMARY

Embodiments of the present disclosure provide a synchronous FIFO, including:

a data storage circuit, a first logic circuit, a second logic circuit and indication circuits, wherein the data storage circuit includes N first registers, N first multiplexers and N first deciders, where N is a positive integer; the N first registers and the N first multiplexers are alternately connected; the N first deciders are in one-to-one correspondence with the N first multiplexers; and the indication circuits are in one-to-one correspondence with the N first registers;

the first register is configured to store data;

the first decider is configured to output a first control signal to the corresponding first multiplexer according to a state value of the first register connected with the corresponding first multiplexer;

the first multiplexer is configured to output, according to the first control signal, data output by an output end of the first register connected with the first multiplexer or data input by a data input end of the synchronous FIFO to an input end of the first register connected with the first multiplexer;

the first logic circuit is configured to obtain a read flag signal according to an empty flag output signal of the synchronous FIFO and a read signal input to the synchronous FIFO;

the second logic circuit is configured to obtain a write flag signal according to a full flag output signal of the synchronous FIFO and a write signal input to the synchronous FIFO; and the indication circuit is configured to obtain the state value of the corresponding first register according to the read flag signal and the write flag signal.

In some embodiments, the Nth first multiplexer is configured to:

output, when the state value of the Nth first register is low, data which is input by the data input end of the synchronous FIFO; and output, when the state value of the Nth first register is high, data which is output by the Nth first register.

In some embodiments, for $1<=j<N$, the jth first multiplexer is configured to:

when the read flag signal is high or the state value of the jth first register is low, and further the state value of the (j+1)th first register is low, output data which is input by the data input end of the synchronous FIFO; and when the read flag signal is high or the state value of the jth first register is low, and further the state value of the (j+1)th first register is high, output data which is output by the (j+1)th first register.

In some implementations, the first logic circuit includes:

a first AND gate and a first NOT gate, wherein an input end of the first NOT gate is connected with the empty flag output signal, an output end of the first NOT gate is connected with a first input end of the first AND gate, a second input end of the first AND gate is connected with the read signal, and an output end of the first AND gate outputs the read flag signal.

In some embodiments, the second logic circuit includes:

a second AND gate and a second NOT gate, wherein an input end of the second NOT gate is connected with the full flag output signal, an output end of the second NOT gate is connected with a first input end of the second AND gate, a second input end of the second AND gate is connected with the write signal, and an output end of the second AND gate outputs the write flag signal.

In some embodiments, the empty flag output signal is obtained by negating the state value output by the indication circuit corresponding to the 1st first register; and the state value output by the indication circuit corresponding to the Nth first register is used as the full flag output signal.

In some embodiments, the indication circuit includes:
a second decider, a second multiplexer and a second register, wherein
the second decider is configured to output a second control signal to the second multiplexer according to the read flag signal and the write flag signal;
the second multiplexer is configured to output, to the second register according to the second control signal, a path of data in data input to the second multiplexer; and
the second register is configured to output the state value of the corresponding first register.

In some embodiments, the second multiplexer in the indication circuit corresponding to the 1st first register is configured to:
when the read flag signal is low and the write flag signal is high, output a numerical value 1;
when the read flag signal is high and the write flag signal is low, output the state value of the 2nd first register; and
when the read flag signal and the write flag signal are both high or low, output the state value of the 1st first register.

In some embodiments, the second multiplexer in the indication circuit corresponding to the Nth first register is configured to:
when the read flag signal is low and the write flag signal is high, output the state value of the (N−1)th first register;
when the read flag signal is high and the write flag signal is low, output a numerical value 0; and
when the read flag signal and the write flag signal are both high or low, output the state value of the Nth first register.

In some embodiments, for $1<j<N$, the second multiplexer in the indication circuit corresponding to the jth first register is configured to:
when the read flag signal is low and the write flag signal is high, output the state value of the (j−1)th first register;
when the read flag signal is high and the write flag signal is low, output the state value of the (j+1)th first register; and
when the read flag signal and the write flag signal are both high or low, output the state value of the jth first register.

The details of one or more embodiments of the present disclosure are set forth in the following drawings and description. Other features and advantages of the present disclosure will become apparent from the specification, drawings and claims.

BRIEF DESCRIPTION OF THE DRAWINGS

To illustrate technical solutions in the embodiments of the present disclosure more clearly, a brief introduction on the drawings which are needed in the illustration of the related art and embodiments is given below. Apparently, the drawings in the description below are merely some of the embodiments of the present disclosure, based on which other drawings may be obtained by those having ordinary skill in the art without any creative effort.

DETAILED DESCRIPTION

The embodiments of the present disclosure provide a synchronous FIFO, which does not need to occupy an RAM, thereby avoiding the RAM wasting resources, and may greatly reduce a chip area in a design with a relatively small storage depth, thereby saving the cost and better facilitating the layout and wiring.

In order to make the objectives, technical solutions and advantages of the embodiments of the present disclosure clearer, a clear and complete description of the technical solutions in the embodiments of the present disclosure will be given below, in combination with the drawings in the embodiments of the present disclosure. Apparently, the embodiments described below are merely a part, but not all, of the embodiments of the present disclosure. All of other embodiments, obtained by those having ordinary skill in the art based on the embodiments in the present disclosure without any creative effort, fall into the protection scope of the present disclosure.

Figure 1:
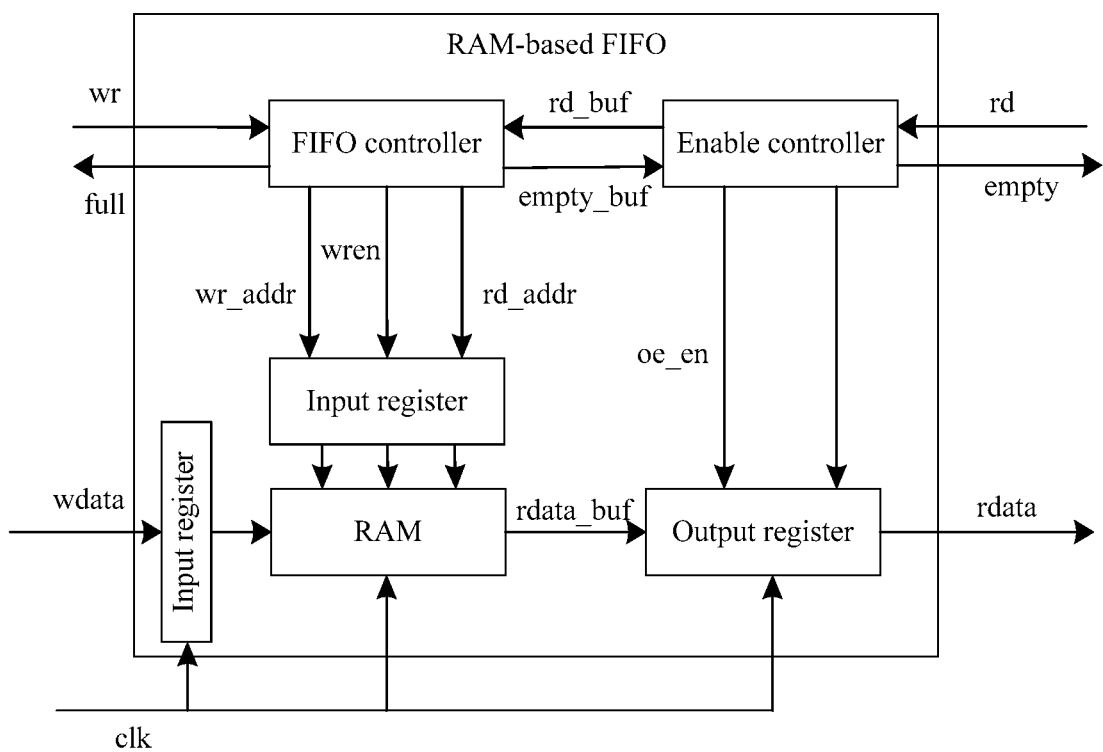
FIG. 1 is a schematic diagram of an FIFO in the related art.
Figure 2:
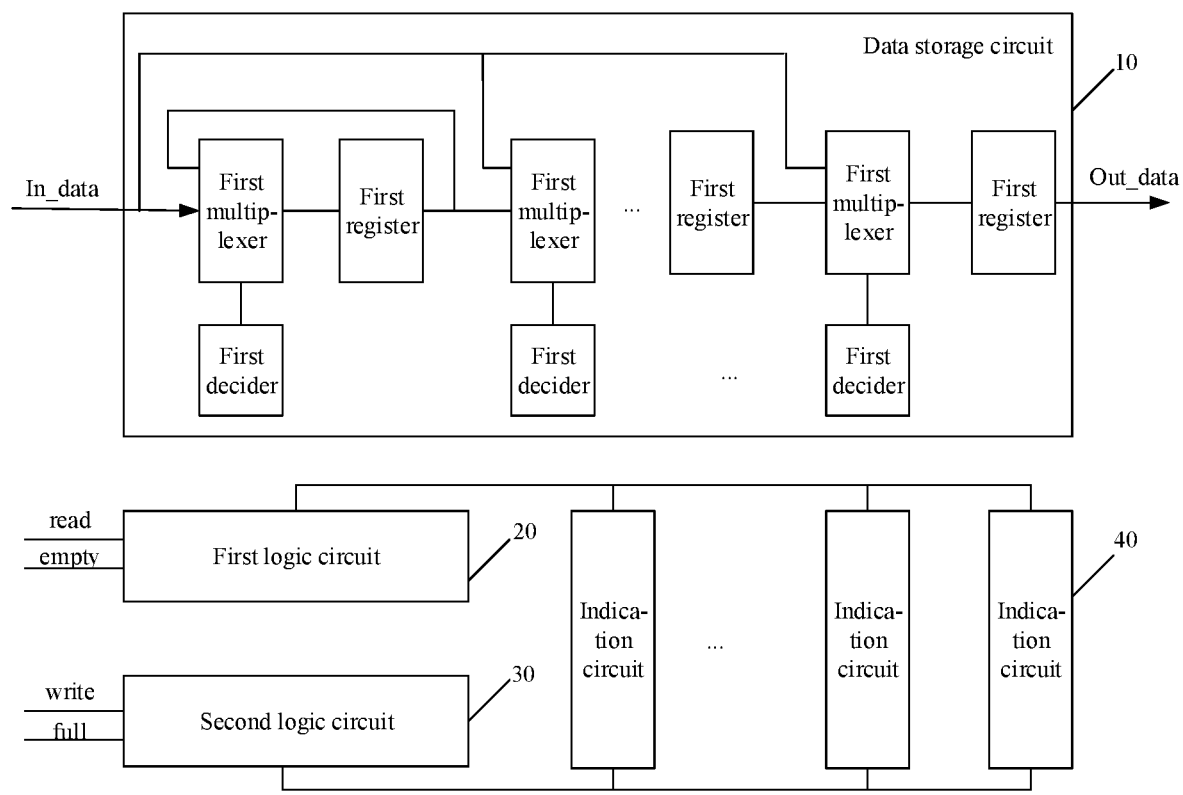
FIG. 2 is a schematic diagram of a synchronous FIFO according to one or more embodiments.

Please to FIG. 2, FIG. 2 is a schematic diagram of a synchronous FIFO provided in one or more embodiments of the present disclosure, and as shown in FIG. 2, the synchronous FIFO mainly includes:
a data storage circuit 10, a first logic circuit 20, a second logic circuit 30 and indication circuits 40.

The data storage circuit 10 includes N first registers, N first multiplexers and N first deciders, where N is a positive integer. The N first registers and the N first multiplexers are alternately connected. In a direction from a data output end (the end where Out_data is located in FIG. 2) of the synchronous FIFO to a data input end (the end where IN_data is located in FIG. 2) of the synchronous FIFO, the 1st first register, the 1st first multiplexer, the 2nd first register, the 2nd first multiplexer, the 3rd first register, the 3rd first multiplexer, and so on, the Nth first register and the Nth first multiplexer are sequentially disposed.

Each first multiplexer has a first decider corresponding to the first multiplexer. An output end of each first multiplexer is connected with an input end of one first register, and an input end of each first multiplexer is connected with a data input end of the synchronous FIFO. The input end of the Nth first multiplexer is further connected with the output end of the Nth first register. The input end of the jth first multiplexer is further connected with the output end of the (j+1)th first register, where $1<=j<N$.

The first register is configured to store data. The first decider is configured to output a first control signal to the corresponding first multiplexer according to a state value of the first register connected with the corresponding first multiplexer. The state value of the first register is used for indicating whether the first register is available, i.e., whether the first register has data stored thereon.

The first multiplexer is configured to output, according to the first control signal, one of two paths of input data, that is, data output by the output end of the first register connected with the first multiplexer or data input via the data input end of the synchronous FIFO, to the input end of the first register connected with the first multiplexer.

Figure 3:
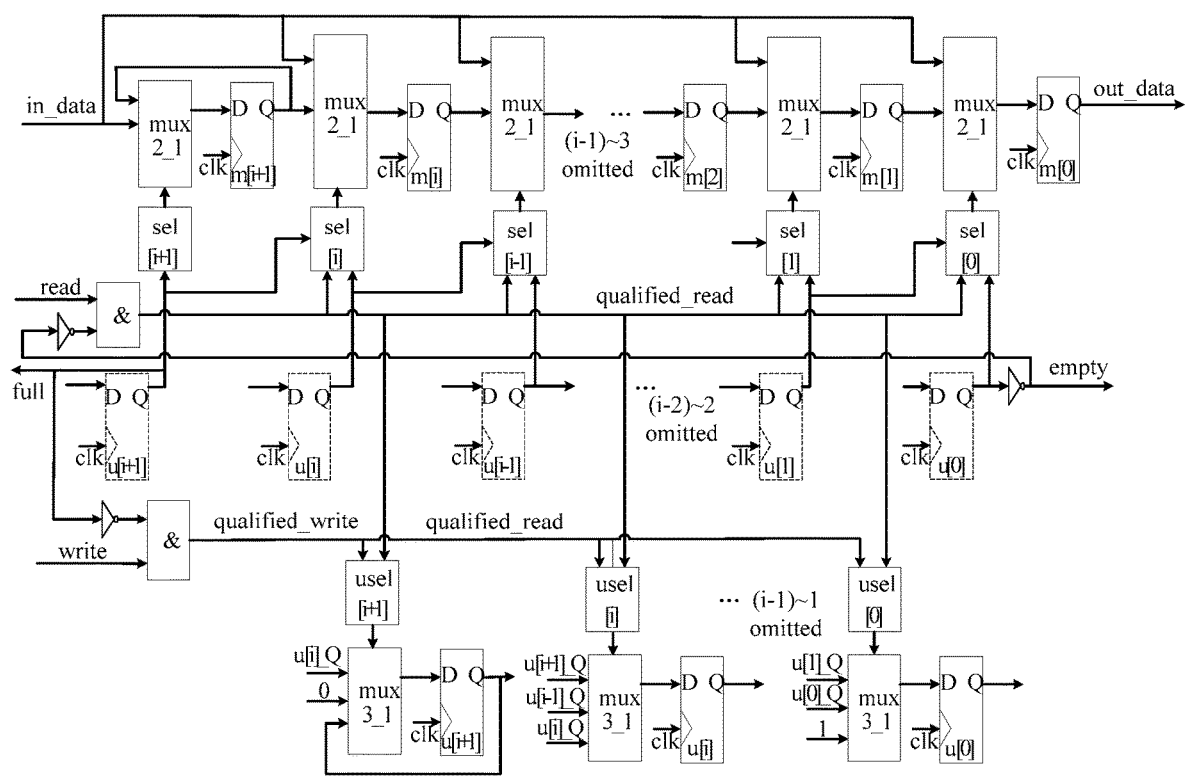
FIG. 3 is a schematic diagram of another synchronous FIFO according to one or more embodiments.

Referring to FIG. 3, in an exemplary implementation, the Nth first multiplexer is configured to:
output, when the state value of the Nth first register is low, data which is input by the data input end of the synchronous FIFO; and output, when the state value of the Nth first register is high, data which is output by the Nth first register.

As an exemplary implementation, the Nth first multiplexer is configured to judge whether the state value of the Nth first register is low, and when judging that the state value of the Nth first register is low, output, based on the judgment result, the data input by the data input end of the synchronous FIFO.

The Nth first multiplexer is configured to judge whether the state value of the Nth first register is high, and when judging that the state value of the Nth first register is high, output, based on the judgment result, the data output by the Nth first register.

For $1 \leq j < N$, the jth first multiplexer is configured to:
when the read flag signal is high or the state value of the jth first register is low, if the state value of the (j+1)th first register is low, output data which is input by the data input end of the synchronous FIFO; and if the state value of the (j+1)th first register is high, output data which is output by the (j+1)th first register.

As an exemplary implementation, the jth first multiplexer is configured to, when the read flag signal is high or the state value of the jth first register is low, further judge whether the state value of the (j+1)th first register is low, and when judging that the state value of the (j+1)th first register is low, output, based on the judgment result, the data input by the data input end of the synchronous FIFO.

The jth first multiplexer is configured to, when the read flag signal is high or the state value of the jth first register is low, further judge whether the state value of the (j+1)th first register is high, and when judging that the state value of the (j+1)th first register is high, output, based on the judgment result, the data output by the (j+1)th first register.

As an exemplary implementation, the first decider (i.e., the Nth first decider, which corresponds to sel[i+1] as shown in FIG. 3) corresponding to the Nth first multiplexer has one path of input, which is the state value of the Nth first register (i.e., m[i+1] in FIG. 3). According to the state value of the Nth first register, the Nth first decider further outputs the first control signal to the corresponding Nth first multiplexer, so that when the state value of the Nth first register is low, the Nth first multiplexer outputs, to the Nth first register, the data input by the data input end of the synchronous FIFO; and when the state value of the Nth first register is high, the Nth first multiplexer outputs the state value of the Nth first register to the Nth first register, that is, maintains the data in the Nth first register unchanged.

The first decider corresponding to the jth ($1 \leq j < N$) first multiplexer has three paths of inputs, which are respectively the read flag signal, the state value of the jth first register, and the state value of the (j+1)th first register.

sel[0] shown in FIG. 3 is the first decider corresponding to the 1st first multiplexer, sel[i] shown in FIG. 3 is the first decider corresponding to the (N−1)th multiplexer, and mux2_1 denotes the first multiplexer.

When the read flag signal is high or the state value of the jth first register, after being negated, is high (that is, the state value of the jth first register is low), if the state value of the (j+1)th first register is low, then the jth first decider outputs the first control signal, so that the jth first multiplexer outputs, to the jth first register, the data input by the data input end of the synchronous FIFO; and if the state value of the (j+1)th first register is high, then the jth first multiplexer outputs, to the jth first register, the data output by the (j+1)th first register.

The first logic circuit 20 is configured to obtain the read flag signal according to an empty flag output signal (empty as shown in FIG. 2) of the synchronous FIFO and a read signal (read as shown in FIG. 2) input to the synchronous FIFO. As an exemplary implementation, when the read signal input to the synchronous FIFO is high and the empty flag output signal is low, the read flag signal is high, and otherwise, the read flag signal is low. The empty flag output signal being high indicates that there is no data in the synchronous FIFO; and the empty flag output signal being low indicates that there is data in the synchronous FIFO.

Referring to FIG. 3, in an exemplary implementation, the first logic circuit 20 includes: a first AND gate and a first NOT gate, wherein an input end of the first NOT gate is connected with the empty flag output signal, an output end of the first NOT gate is connected with a first input end of the first AND gate, a second input end of the first AND gate is connected with the read signal, and an output end of the first AND gate outputs the read flag signal. In FIG. 3, qualified_read denotes the read flag signal.

Therefore, when the empty flag output signal is high, the output is low after the empty flag output signal is negated by the first NOT gate, and at this time, no matter whether the read signal is high or low, the output of the first logic circuit 20 is low. When the empty flag output signal is low, the output is high after the empty flag output signal is negated by the first NOT gate, at this time, when the read signal is high, the output of the first logic circuit 20 is high, and when the read signal is low, the output of the first logic circuit 20 is low.

The second logic circuit 30 is configured to obtain a write flag signal according to a full flag output signal of the synchronous FIFO and a write signal input to the synchronous FIFO. As an exemplary implementation, when the write signal input to the synchronous FIFO is high and the full flag output signal is low, the output of the second logic circuit 30 is high, and otherwise, the output of the second logic circuit 30 is low. The full flag output signal being high indicates that the synchronous FIFO is full of data; and the full flag output signal being low indicates that the synchronous FIFO is not full of data.

Referring to FIG. 3, in an exemplary implementation, the second logic circuit 30 includes: a second AND gate and a second NOT gate, wherein an input end of the second NOT gate is connected with the full flag output signal, an output end of the second NOT gate is connected with a first input end of the second AND gate, a second input end of the second AND gate is connected with the write signal, and an output end of the second AND gate outputs the write flag signal. In FIG. 3, qualified_write denotes the write flag signal.

Therefore, when the full flag output signal is high, the output is low after the full flag output signal is negated by the second NOT gate, and at this time, no matter whether the write signal is high or low, the output of the second logic circuit 30 is low. When the full flag output signal is low, the output is high after the full flag output signal is negated by the second NOT gate, at this time, when the write signal is high, the output of the second logic circuit 30 is high, and when the write signal is low, the output of the second logic circuit 30 is low.

After the state value output by the indication circuit 40 corresponding to the 1st first register is negated, the empty flag output signal is obtained. As an exemplary implementation, the output end of the indication circuit 40 corresponding to the 1st first register may be connected with a NOT gate, and after the state value output by the indication circuit 40 is negated, the empty flag output signal is obtained. The state value output by the indication circuit 40 corresponding to the Nth first register is used as the full flag output signal.

There are N indication circuits 40, and the indication circuits 40 are in one-to-one correspondence with the N first registers. The indication circuit 40 is configured to obtain the state value of the corresponding first register according to the read flag signal and the write flag signal.

In an exemplary implementation, the indication circuit 40 includes:
- a second decider, a second multiplexer and a second register, wherein
- the second decider is configured to output a second control signal to the second multiplexer according to the read flag signal and the write flag signal;
- the second multiplexer is configured to output, to the second register according to the second control signal, a path of data in data input to the second multiplexer; and
- the second register is configured to output the state value of the corresponding first register.

As an exemplary implementation, as shown in FIG. 3, mux3 1 in FIG. 3 denotes the second multiplexer. The second register u[0], the second decider use1[0] and the second multiplexer connected to the second decider use1 [0] constitute an indication circuit 40 which corresponds to the 1st first register (i.e., m[0] as shown in FIG. 3); the second register u[1], the second decider use1[1] and the second multiplexer connected to the second decider use1[1] constitute an indication circuit 40 which corresponds to the 2nd first register (i.e., m[1] as shown in FIG. 3); and so on, the second register u[i], the second decider use1[i] and the second multiplexer connected to the second decider use1[i] constitute an indication circuit 40 which corresponds to the (N−1)th first register (i.e., m[i] as shown in FIG. 3); and the second register u[i+1], the second decider use1[i+1] and the second multiplexer connected to the second decider use1[i+1] constitute an indication circuit 40 which corresponds to the Nth first register.

Each path of second decider has two paths of inputs, that is, the read flag signal and the write flag signal. The second decider outputs the second control signal to the corresponding second multiplexer according to the read flag signal and the write flag signal, so that the second multiplexer outputs, to the corresponding second register, a path of data in data input to the second multiplexer. The output of the second register is the state value of the first register corresponding to the indication circuit 40.

Further, as shown in FIG. 3, in an exemplary implementation, the data output condition of the second multiplexer is as follows:
- the second multiplexer in the indication circuit 40 corresponding to the 1st first register is configured to:
- when the read flag signal is low and the write flag signal is high, output a numerical value 1;
- when the read flag signal is high and the write flag signal is low, output the state value of the 2nd first register; and
- when the read flag signal and the write flag signal are both high or low, output the state value of the 1st first register.

As an exemplary implementation, the second multiplexer in the indication circuit 40 corresponding to the 1st first register is configured to judge whether the read flag signal is low and whether the write flag signal is high, and when judging that the read flag signal is low and the write flag signal is high, outputting the numerical value 1 based on the judgment result.

As an exemplary implementation, the second multiplexer in the indication circuit 40 corresponding to the 1st first register is configured to judge whether the read flag signal is high and whether the write flag signal is low, and when judging that the read flag signal is high and the write flag signal is low, output the state value of the 2nd first register based on the judgment result.

As an exemplary implementation, the second multiplexer in the indication circuit 40 corresponding to the 1st first register is configured to judge whether the read flag signal and the write flag signal are both high or low, and when judging that the read flag signal and the write flag signal are both high or low, output the state value of the 1st first register.

The second multiplexer in the indication circuit 40 corresponding to the Nth first register is configured to:
- when the read flag signal is low and the write flag signal is high, output the state value of the (N−1)th first register;
- when the read flag signal is high and the write flag signal is low, output a numerical value 0; and
- when the read flag signal and the write flag signal are both high or low, output the state value of the Nth first register.

As an exemplary implementation, the second multiplexer in the indication circuit 40 corresponding to the Nth first register is configured to judge whether the read flag signal is low and whether the write flag signal is high, and when judging that the read flag signal is low and the write flag signal is high, output the state value of the (N−1)th first register based on the judgment result.

As an exemplary implementation, the second multiplexer in the indication circuit 40 corresponding to the Nth first register is configured to judge whether the read flag signal is high and whether the write flag signal is low, and when judging that the read flag signal is high and the write flag signal is low, outputting the numerical value 0 based on the judgment result.

As an exemplary implementation, the second multiplexer in the indication circuit 40 corresponding to the Nth first register is configured to judge whether the read flag signal and the write flag signal are both high or low, and when judging that the read flag signal and the write flag signal are both high or low, output the state value of the Nth first register based on the judgment result.

For 1<j<N, the second multiplexer in the indication circuit 40 corresponding to the jth first register is configured to:
- when the read flag signal is low and the write flag signal is high, output the state value of the (j−1)th first register;
- when the read flag signal is high and the write flag signal is low, output the state value of the (j+1)th first register; and
- when the read flag signal and the write flag signal are both high or low, output the state value of the jth first register.

As an exemplary implementation, the second multiplexer in the indication circuit 40 corresponding to the jth first register is configured to judge whether the read flag signal is low and whether the write flag signal is high, and when judging that the read flag signal is low and the write flag signal is high, output the state value of the (j−1)th first register based on the judgment result.

As an exemplary implementation, the second multiplexer in the indication circuit 40 corresponding to the jth first register is configured to judge whether the read flag signal is high and whether the write flag signal is low, and when judging that the read flag signal is high and the write flag signal is low, outputting the state value of the (j+1)th first register based on the judgment result.

As an exemplary implementation, the second multiplexer in the indication circuit 40 corresponding to the jth first register is configured to judge whether the read flag signal and the write flag signal are both high or low, and when judging that the read flag signal and the write flag signal are both high or low, output the state value of the jth first register based on the judgment result.

As an exemplary implementation, each second multiplexer has three paths of inputs.

The inputs of the second multiplexer in the indication circuit 40 corresponding to the 1st first register are the numerical value 1, the state value (u[1]_Q as shown in FIG. 3) of the 2nd first register, and the state value (u[0]_Q as shown in FIG. 3) of the 1st first register. When the read flag signal is low and the write flag signal is high, the numerical value 1 is output to u[0]. When the read flag signal is high and the write flag signal is low, the state value of the 2nd first register is output, that is, the state value of m[1] is output to u[0]. When the read flag signal and the write flag signal are both high or low, the state value of the 1st first register is output, that is, the state value of m[0] is output to u[0], that is, the data in u[0] is maintained unchanged.

The inputs of the second multiplexer in the indication circuit 40 corresponding to the Nth first register are the numerical value 0, the state value (u[i]_Q as shown in FIG. 3) of the (N−1)th first register, and the state value of the Nth first register. When the read flag signal is low and the write flag signal is high, the state value of the (N−1)th first register is output to u[i+1]. When the read flag signal is high and the write flag signal is low, the numerical value 0 is output to u[i+1]. When the read flag signal and the write flag signal are both high or low, the state value of the Nth first register is output to u[i+1].

The inputs of the second multiplexer in the indication circuit 40 corresponding to the jth (1<j<N) first register are the state value (u[i−1]_Q as shown in FIG. 3) of the (j−1)th first register, the state value (u[i+1]_Q as shown in FIG. 3) of the (j+1)th first register, and the state value (u[i]_Q as shown in FIG. 3) of the jth first register. When the read flag signal is low and the write flag signal is high, the state value of the (j−1)th first register is output to u[i]; when the read flag signal is high and the write flag signal is low, the state value of the (i+1)th first register is output to u[i]; and when read flag signal and the write flag signal are both high or low, the state value of the (j+1)th first register is output to u[i].

It should be noted that, the register represented by a dashed line in FIG. 3 is the same as the register represented by a solid line having the same name. For example, the second register u[0] represented by the dashed line is the same second register as the second register u[0] represented by the solid line.

In summary, based on the registers, the synchronous FIFO provided in the embodiments of the present disclosure builds a storage required by the FIFO, the use of an RAM is avoided, that is, there is no need to occupy the RAM, and there is no need to perform RAM read-write enabling and address control, thereby avoiding wasting RAM resources. In designs with lower storage depth requirements, few resources are occupied, so that a chip area is greatly reduced, the cost is reduced, and layout and wiring are more convenient.

As the situations are complex and cannot be set forth one by one, those having ordinary skill in the art should be aware that, there may be a plurality of examples in combination with the actual situations under the basic principles of the embodiments provided in the present disclosure, and these examples obtained without paying enough creative efforts shall all fall within the scope of the application.

Various embodiments in the specification are described in a progressive manner, what is highlighted in each embodiment is the difference with other embodiments, and the identical or similar parts between the various embodiments refer to each other.

The synchronous FIFO provided in the embodiments of the present disclosure has been described in detail above. Specific examples are used herein to describe the principles and embodiments of the present disclosure, and the description of the above embodiments is merely used to help understand the method of the present disclosure and the core ideas thereof. It should be noted that, for those having ordinary skill in the art, several improvements and modifications may also be made to the present disclosure without departing from the principles of the present disclosure, and these improvements and modifications also fall within the protection scope of the claims of the present disclosure.

It should also be noted that, in the present specification, relational terms, such as first and second, are merely used for distinguishing one entity or operation from another entity or operation, and do not necessarily require or imply that any such actual relationship or sequence exists between these entities or operations. Moreover, the terms "include", "contain" or any other variants thereof are intended to cover non-exclusive inclusions, such that a process, a method, an article or a device including a series of elements not only includes those elements, but also includes other elements that are not explicitly listed, or also includes elements inherent to such a process, method, article or device. If there are no more restrictions, the element defined by the sentence "including a . . . " does not exclude the existence of other identical elements in the process, the method, the article or the device that includes the element.

What is claimed is:

1. A synchronous First Input First Output (FIFO), comprising:
    a data storage circuit, a first logic circuit, a second logic circuit and indication circuits, wherein the data storage circuit comprises N first registers, N first multiplexers and N first deciders, where N is a positive integer; the N first registers and the N first multiplexers are alternately connected; the N first deciders are in one-to-one correspondence with the N first multiplexers; and the indication circuits are in one-to-one correspondence with the N first registers;
    the first register is configured to store data;
    the first decider is configured to output a first control signal to the corresponding first multiplexer according to a state value of the first register connected with the corresponding first multiplexer;
    the first multiplexer is configured to output, according to the first control signal, data output by an output end of the first register connected with the first multiplexer or data input by a data input end of the synchronous FIFO to an input end of the first register connected with the first multiplexer;
    the first logic circuit is configured to obtain a read flag signal according to an empty flag output signal of the synchronous FIFO and a read signal input to the synchronous FIFO;

the second logic circuit is configured to obtain a write flag signal according to a full flag output signal of the synchronous FIFO and a write signal input to the synchronous FIFO; and the indication circuit is configured to obtain the state value of the corresponding first register according to the read flag signal and the write flag signal.

2. The synchronous FIFO according to claim 1, wherein the Nth first multiplexer is configured to:
output, when the state value of the Nth first register is low, data which is input by the data input end of the synchronous FIFO; and
output, when the state value of the Nth first register is high, data which is output by the Nth first register.

3. The synchronous FIFO according to claim 1, wherein for $1<=j<N$, the jth first multiplexer is configured to:
when the read flag signal is high or the state value of the jth first register is low, and further the state value of the (j+1)th first register is low, output data which is input by the data input end of the synchronous FIFO; and
when the read flag signal is high or the state value of the jth first register is low, and further the state value of the (j+1)th first register is high, output data which is output by the (j+1)th first register.

4. The synchronous FIFO according to claim 1, wherein the first logic circuit comprises:
a first AND gate and a first NOT gate, wherein
an input end of the first NOT gate is connected with the empty flag output signal, an output end of the first NOT gate is connected with a first input end of the first AND gate, a second input end of the first AND gate is connected with the read signal, and an output end of the first AND gate outputs the read flag signal.

5. The synchronous FIFO according to claim 1, wherein the second logic circuit comprises:
a second AND gate and a second NOT gate, wherein
an input end of the second NOT gate is connected with the full flag output signal, an output end of the second NOT gate is connected with a first input end of the second AND gate, a second input end of the second AND gate is connected with the write signal, and an output end of the second AND gate outputs the write flag signal.

6. The synchronous FIFO according to claim 1, wherein the empty flag output signal is obtained by negating the state value output by the indication circuit corresponding to the 1st first register; and the state value output by the indication circuit corresponding to the Nth first register is used as the full flag output signal.

7. The synchronous FIFO according to claim 1, wherein the indication circuit comprises:
a second decider, a second multiplexer and a second register, wherein
the second decider is configured to output a second control signal to the second multiplexer according to the read flag signal and the write flag signal;
the second multiplexer is configured to output, to the second register according to the second control signal, a path of data in data input to the second multiplexer; and
the second register is configured to output the state value of the corresponding first register.

8. The synchronous FIFO according to claim 7, wherein the second multiplexer in the indication circuit corresponding to the 1st first register is configured to:
when the read flag signal is low and the write flag signal is high, output a numerical value 1;

when the read flag signal is high and the write flag signal is low, output the state value of the 2nd first register; and
when the read flag signal and the write flag signal are both high or low, output the state value of the 1st first register.

9. The synchronous FIFO according to claim 7, wherein the second multiplexer in the indication circuit corresponding to the Nth first register is configured to:
when the read flag signal is low and the write flag signal is high, output the state value of the (N−1)th first register;
when the read flag signal is high and the write flag signal is low, output a numerical value 0; and
when the read flag signal and the write flag signal are both high or low, output the state value of the Nth first register.

10. The synchronous FIFO according to claim 7, wherein for $1<j<N$, the second multiplexer in the indication circuit corresponding to the jth first register is configured to:
when the read flag signal is low and the write flag signal is high, output the state value of the (j−1)th first register;
when the read flag signal is high and the write flag signal is low, output the state value of the (j+1)th first register; and
when the read flag signal and the write flag signal are both high or low, output the state value of the jth first register.

11. The synchronous FIFO according to claim 1, wherein the first logic circuit is respectively connected to the indication circuits and the data storage circuit; the second logic circuit is connected to the indication circuits; and the indication circuits are further connected to the data storage circuit.

12. The synchronous FIFO according to claim 2, wherein the first decider corresponding to the Nth first multiplexer has one path of input, which is the state value of the Nth first register, and the first decider corresponding to the Nth first multiplexer is configured to output the first control signal to the corresponding Nth first multiplexer according to the state value of the Nth first register, so that when the state value of the Nth first register is low, the Nth first multiplexer outputs, to the Nth first register, the data input by the data input end of the synchronous FIFO, and when the state value of the Nth first register is high, the Nth first multiplexer outputs the state value of the Nth first register to the Nth first register.

13. The synchronous FIFO according to claim 3, wherein for $1<=j<N$, the first decider corresponding to the jth first multiplexer has three paths of inputs, which are respectively the read flag signal, the state value of the jth first register, and the state value of the (j+1)th first register, and the first decider corresponding to the jth first multiplexer is configured to output the first control signal to the corresponding (j+1)th first multiplexer according to the read flag signal, the state value of the jth first register, and the state value of the (j+1)th first register, so that the jth first multiplexer outputs the data input by the data input end of the synchronous FIFO when the read flag signal is high or the state value of the jth first register is low, and further the state value of the (j+1)th first register is low, and outputs the data output by the (j+1)th first register when the read flag signal is high or the state value of the jth first register is low, and further the state value of the (j+1)th first register is high.

14. The synchronous FIFO according to claim 1, wherein the first logic circuit is configured to, when the read signal input to the synchronous FIFO is high and the empty flag output signal is low, determine the read flag signal as high, and otherwise, determine the read flag signal as low.

15. The synchronous FIFO according to claim 14, wherein the empty flag output signal being high indicates that there is no data in the synchronous FIFO; and the empty flag output signal being low indicates that there is data in the synchronous FIFO.

16. The synchronous FIFO according to claim 1, wherein the second logic circuit is configured to: when the write signal input to the synchronous FIFO is high and the full flag output signal is low, output the write flag signal as high, and otherwise, output the write flag signal as low.

17. The synchronous FIFO according to claim 16, wherein the full flag output signal being high indicates that the synchronous FIFO is full of data; and the full flag output signal being low indicates that the synchronous FIFO is not full of data.

18. The synchronous FIFO according to claim 4, wherein when the empty flag output signal is high, the output is low after the empty flag output signal is negated by the first NOT gate, and no matter whether the read signal is high or low, the output of the first logic circuit is low; when the empty flag output signal is low, the output is high after the empty flag output signal is negated by the first NOT gate, when the read signal is high, the output of the first logic circuit is high, and when the read signal is low, the output of the first logic circuit is low.

19. The synchronous FIFO according to claim 5, wherein when the full flag output signal is high, the output is low after the full flag output signal is negated by the second NOT gate, and no matter whether the write signal is high or low, the output of the second logic circuit is low; when the full flag output signal is low, the output is high after the full flag output signal is negated by the second NOT gate, when the write signal is high, the output of the second logic circuit is high, and when the write signal is low, the output of the second logic circuit is low.

20. The synchronous FIFO according to claim 6, wherein the output end of the indication circuit corresponding to the 1st first register is connected with a NOT gate, and after the state value output by the indication circuit corresponding to the 1st first register is negated by the NOT gate, the empty flag output signal is obtained.

* * * * *